(12) United States Patent
Byun

(10) Patent No.: US 7,843,744 B2
(45) Date of Patent: Nov. 30, 2010

(54) SEMICONDUCTOR MEMORY DEVICE AND OPERATION METHOD THEREOF

(75) Inventor: Hee-Jin Byun, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 326 days.

(21) Appl. No.: 12/165,083

(22) Filed: Jun. 30, 2008

(65) Prior Publication Data

US 2009/0273993 A1    Nov. 5, 2009

(30) Foreign Application Priority Data

Apr. 30, 2008    (KR) ...................... 10-2008-0040860

(51) Int. Cl.
*G11C 7/00* (2006.01)
(52) U.S. Cl. .................. 365/194; 365/193; 365/189.08; 365/233.11
(58) Field of Classification Search ................. 365/191, 365/193, 194, 189.08, 189.06, 233.1, 233.11
See application file for complete search history.

(56) References Cited

U.S. PATENT DOCUMENTS 6,198,674 B1 * 3/2001 Kim ........................... 365/193
6,489,819 B1 * 12/2002 Kono et al. .................. 327/141
6,525,988 B2 * 2/2003 Ryu et al. .................... 365/194
2008/0205186 A1 * 8/2008 Kim et al. .............. 365/230.06
2010/0103746 A1 * 4/2010 Ma ........................ 365/189.05

FOREIGN PATENT DOCUMENTS

KR    1020010046340 A    6/2001
KR    1020070119378 A    12/2007

OTHER PUBLICATIONS

Notice of Allowance issued from Korean Intellectual Property Office on May 26, 2009 with an English Translation.

* cited by examiner

*Primary Examiner*—Anh Phung
*Assistant Examiner*—Hien N Nguyen
(74) *Attorney, Agent, or Firm*—IP & T Group LLP

(57) ABSTRACT

A semiconductor memory device that generates a data strobe reset signal for preventing ring-back of a data strobe signal, and an operation method thereof. The semiconductor memory device includes a pulse signal generating unit for generating first and second pulse signals by synchronizing a write instruction with first and second internal clock signals, a reset signal generating unit for generating a reset signal having an activation width setup in response to the first and second pulse signals, and a data strobe reset signal generating unit for generating a data strobe reset signal by shifting the second pulse signal as much as a predetermined burst length and limiting an activation period of the data strobe reset signal in response to the reset signal.

33 Claims, 10 Drawing Sheets

CONVENTIONAL TDQSS MARGIN

TDQSS MARGIN ACCORDING TO THE PRESENT INVENTION

SEMICONDUCTOR MEMORY DEVICE AND OPERATION METHOD THEREOF

CROSS-REFERENCE TO RELATED APPLICATION

The present invention claims priority of Korean patent application number No. 10-2008-0040860, filed on Apr. 30, 2008, which is incorporated by reference in its entirety.

BACKGROUND OF THE INVENTION

The present invention relates to semiconductor design, and more particularly, to a semiconductor memory device for generating a data strobe reset signal for preventing ring-back of a data strobe signal, and an operation method thereof.

In general, a semiconductor memory device performs a write operation for receiving data from an external circuit such as a chip set and storing the received data, and also performs a reading operation for outputting the stored data to a chipset. Lately, data are transmitted and received with a data strobe signal for high speed data transmission. Here, the data strobe signal basically sustains high impedance when toggled with synchronized data, and sustains high impedance when the data ends. However, the data strobe signal may cause ring-back. Therefore, the data strobe signal is reset to a logical 'low' level by a data strobe reset signal FIG. 1 is a block diagram illustrating a partial circuit of a semiconductor memory device for generating a data strobe reset signal according to the related art.

Referring to FIG. 1, the semiconductor memory device includes a write pulse signal generator 110, a shifter 120, a first reset signal generator 130, an output selector 140, a reset signal output unit 150, and a second reset signal generator 160.

The write pulse signal generator 110 synchronizes a write instruction WT with an internal clock signal CLKP4 and outputs a write pulse signal WTP. The write pulse signal WTP is a pulse signal that is activated when the semiconductor memory device performs a write operation. The write pulse signal WTP informs a plurality of internal circuits of a write operation time. The internal clock signal CLKP4 is a slightly delayed signal compared to an external clock signal. The internal clock signal CLKP4 is a clock signal considered with a setup-hold time of the write instruction WT. For the reference, the write instruction WT is one of internal instructions that are generated by decoding a chip select signal, a row address strobe signal, a column address strobe signal, and a write enable signal, which are external instruction signals. The internal instructions may further include a read instruction, a pre-charge instruction, and an active instruction.

The design of the write pulse signal generator 110 is similar to a circuit for processing an external instruction such as a write instruction WT to be used internally. That is, the write pulse signal WTP is a signal inputted to a plurality of internal circuits when a write operation of the semiconductor memory device is performed. Therefore, the write pulse signal generator 110 cannot be designed specifically suitable to a predetermined internal circuit. That is, the write pulse generator 110 must be designed to a proper location in consideration of all of internal circuits. So, the write pulse signal WTP is transferred to the shifter 120 and the first and second reset signal generators 130 and 160 with slight delay due to a long transmission line.

The shifter 120 generates first to third shifting signal SFT_WTP1, SFT_WTP2, and SFT_WTP4 by shifting the write pulse signal in response to an internal clock signal CLKP4 and performs a reset operation in response to a first reset signal RSTB1. That is, the first to third shifting signals SFT_WTP1, SFT_WTP2, and SFT_WTP4 are reset to a predetermined logical level value in response to the first reset signal RSTB1.

The first reset signal generator 130 generates a power up signal PWRUP and a first reset signal RSTB in response to the write pulse signal WTP. The power up signal PWRUP is a signal activated if an external power voltage has an enough voltage level in a power on state of the semiconductor memory device. The semiconductor memory device can prevent critical damage such as latchup using the power up signal PWRUP. For the reference, the power up signal PWRUP has a characteristic that a ground power voltage is sustained while the external power voltage increases to a target voltage level and the ground power voltage transits to the external power voltage if the external power voltage becomes greater than the target voltage level.

FIG. 2 is a circuit diagram illustrating a first reset signal generator 130 of FIG. 1.

Referring to FIG. 2, the first reset signal generator 130 includes a first inverter INVL for receiving and inverting a power up signal PWRUP and a first NOR gate NOR1 for generating a first reset signal RSTB1 in response to a write pulse signal WTP and an output signal of the first inverter INV1. The first reset signal generator 130 outputs a first reset signal RSTB1 by inverting the write pulse signal WTP after the power up signal PWRUP transmits because it becomes greater than the target voltage level.

Referring to FIG. 1 again, the output selector 140 selects one of the first to third shifting signals SFT_WTP1, SFT_WTP2, and SFT_WTP4 according to first to third burst length BL2, BL4, and BL8. The first burst length BL2 is activated when a burst length is 2, the second burst length BL4 is activated when the burst length is 4, and the third burst length BL8 is activated when the burst length is 8. In general, the output selector 140 selects the first shifting signal SFT_WTP1, which is obtained by shifting the write pulse signal WTP once when the burst length is 2. Also, the output selector 140 selects the second shift signal SFT_WTP2, which is obtained by shifting the write pulse signal WTP twice when the burst length is 4. The output selector 140 selects the third shifting signal WT4, which is obtained by shifting the write pulse signal WTP four times when the burst length is 8.

The reset signal output unit 150 generates a data strobe reset signal DISDSP in response to an output signal of the output selector 140 and a control clock signal DSFP2. The control clock signal DSFP2 is a signal generated in response to a falling edge of the data strobe signal (see FIG. 3). The reset signal output unit 150 performs a reset operation in response to the second reset signal RSTB2. That is, the data strobe reset signal DISDSP is reset in response to a second reset signal RSTB2.

The second reset signal generator 160 generates a second reset signal RSTB2 in response to a write pulse signal WTP. Here, the second reset signal RSTB2 is a signal obtained by inverting the write pulse signal and extending a pulse width thereof. FIG. 3 shows the second reset signal RSTB2.

Meanwhile, the data strobe signal is reset to a predetermined logical level value in response to the generated data strobe reset signal DISDSP. Finally, the ring-back of the data strobe signal is prevented.

However, a data strobe reset signal generating circuit according to the related art has below problems when the write operation is performed continuously. Hereinafter, the problem of the data strobe reset signal generating circuit will be described with reference to FIG. 3.

FIG. 3 is a timing diagram for describing timing of each signal in FIG. 1. FIG. 3 illustrates an internal clock signal CLKP4, a write pulse signal WTP, a first reset signal RSTB1, a second shifting signal SFT_WTP2, a control clock signal DSFP2, a second reset signal RSTB2, a data strobe reset signal DISDSP, an extern data strobe signal DQS inputted from an external device, and an internal data strobe signal DQS_INN internally used. For convenience, those signals will be described when the burst length is 4. That is, the output selector 140 (see FIG. 1) selects the second shifting signal SFT_WTP2 in response to the second burst length BL4. Here, the second shifting signal SFT_WTP2 is a signal obtained by shifting the write pulse signal WTP twice in response to the internal clock signal CLKP4.

Referring to FIGS. 1 and 3, a write pulse signal WTP synchronized with the internal clock signal CLKP4 is activated when a first write instruction TW1 is applied. The write pulse signal WTP is transferred to the shifter 120 and the first and second reset signal generators 130 and 160 with slight delay due to a long transmission line as shown in drawings.

Continuously, the first and second reset signals RSTB1 and RSTB2 are activated in response to the delayed write pulse signal WTP. The first reset signal RSTB1 is a signal obtained by inverting the write pulse signal WTP, and the second reset signal RSTB2 is a signal obtained by inverting the write pulse signal WTP and extending a pulse width thereof.

After releasing from reset by the first reset signal RSTB1, the shifter 120 shifts the activated write pulse signal WTP in response to an internal clock signal CLKP4, and the output selector 140 outputs the second shifting signal SFT_WTPS corresponding to the burst length 4 as shown in ①. Then, the second shifting signal SFT_WTPS2 activates a data strobe reset signal DISDSP corresponding to the first write instruction TW1. Meanwhile, if the second write instruction WT2 is consecutively applied, the internal data strobe is reset to a logical low as shown in ② although the external data strobe signal DQS is activated and applied to the semiconductor memory device.

In other words, the second shifting signal SFT_WTP2 is activated corresponding to the first write instruction TW1 as shown in ①, and the activate second shifting signal SFT_WTP2 activates a data strobe reset signal DISDSP so as to reset the internal strobe signal DQS_INN to a logical low as shown in ② although the second write instruction WT2 is applied. That is, a pulse width of the internal data strobe signal DQS_INN corresponding to the second write instruction WT2 is reduced Meanwhile, if the internal data strobe signal DQS_INN and data cannot satisfy tDQSS with data assigned as SPEC., data cannot be inputted. Here, tDQSS defines a period of inputting data with the internal data strobe signal DQS_INN as a reference. The data must be inputted to be suitable to tDQSS with the internal data strobe signal DQS_INN as a reference.

However, a pulse width of the internal data strobe signal (DQS_INN) is reduced due to an undesired activation of the data strobe reset signal DISDSP in a circuit. It is because glitch is generated at the second shifting signal SFT_WTP2 as shown in ①. As described above, if the pulse width of the data strobe signal DQS_INN is reduced by glitch, the semiconductor memory device cannot properly receive data.

Such a problem becomes serious as an operation frequency of the semiconductor memory device gradually increases to a high frequency. Therefore, the semiconductor memory device cannot internally recognize data although the semiconductor memory device receives data from an external device. Such a problem decreases reliability of the semiconductor memory device.

SUMMARY OF THE INVENTION

Embodiments of the present invention are directed to providing a semiconductor memory device for substantially removing glitch that causes undesired activation of a data strobe reset signal.

Embodiments of the invention are directed to providing a semiconductor memory device for guaranteeing an internal data strobe signal and tDQSS of data using a stable data strobe reset signal.

In accordance with an aspect of the invention, there is provided a semiconductor memory device including: a pulse signal generating unit for generating first and second pulse signals by synchronizing a write instruction with first and second internal clock signals; a reset signal generating unit for generating a reset signal having an activation width setup in response to the first and second pulse signals; and a data strobe reset signal generating unit for generating a data strobe reset signal by shifting the second pulse signal as much as a predetermined burst length and limiting an activation period of the data strobe reset signal in response to the reset signal.

In accordance with another aspect of the invention, there is provided a semiconductor memory device, including: a pulse signal generating unit for generating first and second pulse signal by synchronizing a write instruction with first and second internal clock signals; a reset signal generating unit for generating a reset signal having an activate width that is setup in response to the first and second pulse signals; a shifting unit for being reset in response to the reset signal and for shifting the second pulse signal in response to the second internal clock signal; and a data strobe reset signal for outputting a shifting signal corresponding to a predetermined burst length among output signals of the shifting unit as a data strobe reset signal.

In accordance with another aspect of the invention, there is provided a semiconductor memory device including: a pulse signal generating unit for generating first and second pulse signals by synchronizing a write instruction with first and second internal clock signals; a first reset signal generating unit for generating a first reset signal having an activation width setup in response to the first and second pulse signals; a second reset signal generating unit for generating a second reset signal by delaying a pulse width of the first reset signal as long as a predetermined time; a shifting unit for shifting the second pulse signal in response to the second internal clock signal; an output selecting unit for selectively outputting a shifting signal corresponding to predetermined burst length among output signals of the shifting unit; and a data strobe reset signal output unit for being reset in response to the second rest signal and for outputting an output signal of the output selecting unit as a data strobe reset signal.

In accordance with another aspect of the invention, there is provided a method for driving a semiconductor memory device, including: generating a first pulse signal by synchronizing a write instruction with a first internal clock signal faster than a second internal clock signal; generating a second pulse signal by synchronizing the write instruction with the second internal clock signal; generating a data strobe reset signal by shifting the second pulse signal as much as a predetermined burst length in response to the second internal clock signal; and limiting an activation period of the data strobe reset signal in response to the first pulse signal.

DESCRIPTION OF SPECIFIC EMBODIMENTS

Hereinafter, a register controlled DLL circuit in accordance with the present invention will be described in detail with reference to the accompanying drawings.

Figure 4:
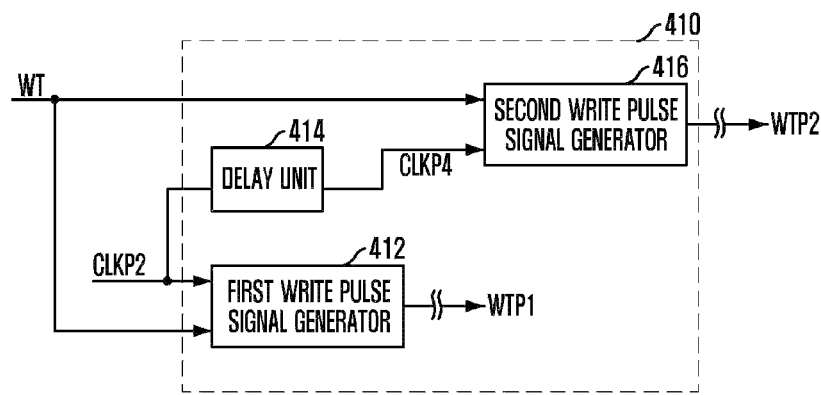
FIG. 4 is a block diagram illustrating a part of a semiconductor memory device in accordance with a first embodiment of the present invention.
Figure 4:
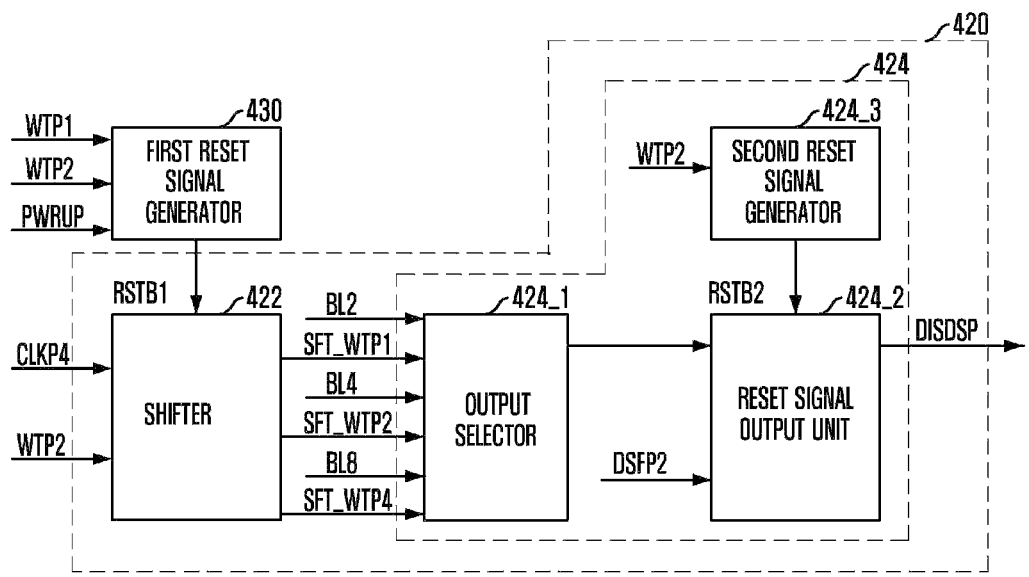

FIG. 4 is a block diagram illustrating a part of a semiconductor memory device in accordance with a first embodiment of the invention.

Referring to FIG. 4, the semiconductor memory device according to the present embodiment includes a write pulse signal generator 410, a data strobe reset signal generator 420, and a reset signal generator 430.

The write pulse signal generator 410 generates a first write pulse signal WTP1 and a second write pulse signal WTP2 by synchronizing a write instruction WT with a first internal clock signal CLKP2 and a second internal clock signal CLKP4. The write pulse signal generator 410 includes a first write pulse signal generator 412, a delay unit 414, and a second write pulse signal generator 416.

The first write pulse signal generator 412 generates a first write pulse signal WTP1 by synchronizing a write instruction WT with a first internal clock signal CLKP2. The delay unit 414 generates a second internal clock signal CLKP4 by delaying the first internal clock signal CLKP1 as long as a predetermined time. The second write pulse signal generator 416 generates a second write pulse signal WTP2 by synchronizing a write instruction WT with the second internal clock signal CLKP4. The second write pulse signal generator 416 may control a setup-hold time of the write instruction WT.

Figure 1:
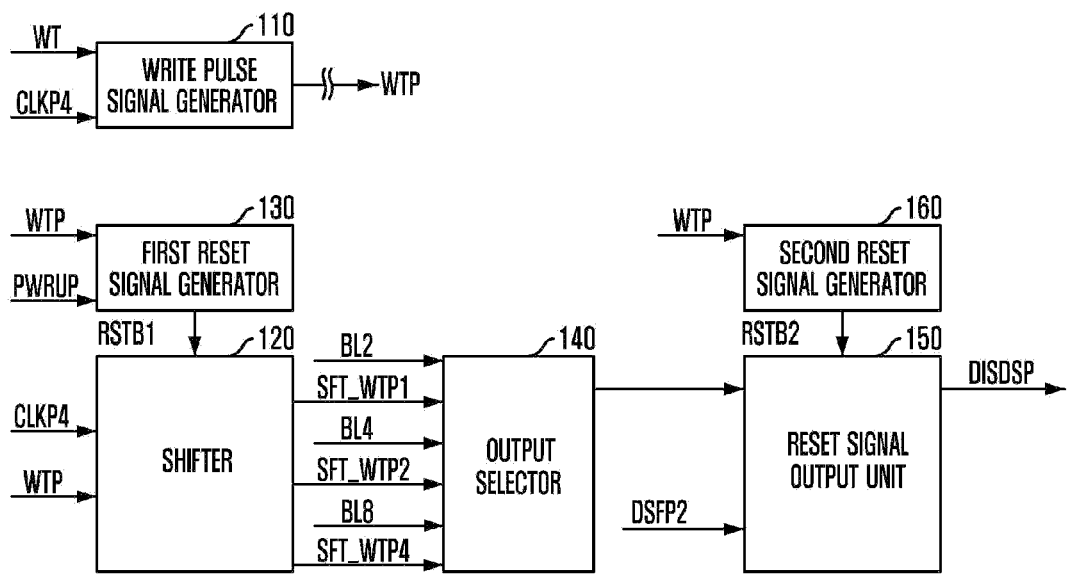
FIG. 1 is a block diagram illustrating a partial circuit of a semiconductor memory device for generating a data strobe reset signal in accordance with a related art.
Figure 2:
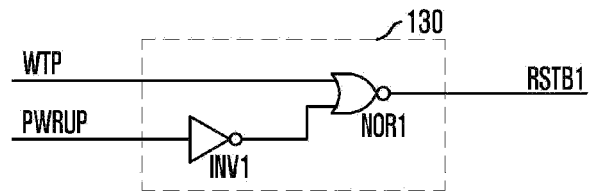
FIG. 2 is a circuit diagram illustrating a first reset signal generator of FIG. 1.

The first write pulse signal generator 412 and the second write pulse signal generator 416 may have a similar structure. The first write pulse signal generator 412 may not have a part (not shown) for controlling a setup-hold time of the second write pulse signal generator 416. Also, the second write pulse signal generator 416 substantially have the same structure of the typical pulse signal generator 110 (see FIG. 1) and performs the same operation thereof. Therefore, the detailed description thereof is omitted. The first write pulse signal generator 412 according to the present embodiment may generate a first write pulse signal WTP1 which is synchronized using the first internal clock signal CLKP2 that is one phase faster than the second internal clock signal CLKP4 which is inputted to the second write pulse signal generator 416.

The second write pulse signal WTP2 is a pulse signal activated when a semiconductor memory device performs a write operation. The second write pulse signal WTP2 is a signal for informing a plurality of internal circuits of a write operation time. The first and second internal clock signals CLKP2 and CLKP4 are signals delayed slightly compared to an external clock signal. For example, the first internal clock signal CLKP2 is a signal obtained by delaying the external clock signal as long as two gate ends, and the second internal clock signal CLKP4 is a signal obtained by delaying the external clock signal as long as four gate ends. Therefore, the delay unit 414 receives the first internal clock signal CLKP2 and outputs the second internal clock signal CLKP4 by reflecting a delay time corresponding to two gate ends. Meanwhile, the second internal clock signal CLKP4 is a clock signal with a setup-hold time of a write instruction WT considered. Therefore, the second internal clock signal CLKP4 may have the same timing of the internal clock signal.

The write instruction WT is one of internal instructions that are generated by decoding an external instruction signal such as a chip select signal, a row address strobe signal, a column address strobe signal, and a write enable signal. The internal instructions may also include a read instruction, a pre-charge instruction, and an active instruction.

The write pulse signal generator 410 is designed similar to circuits for receiving and processing an external instruction such as a write instruction WT to be used internally. In other words, the second write pulse signal WTP2 is a signal inputted to a plurality of internal circuits when the semiconductor memory device performs a write operation. The write pulse signal generator 410 cannot be designed for a predetermined location in a specific internal circuit. That is, the write pulse signal generator 410 must be designed to be disposed at a proper location in consideration of all of internal circuits. Therefore, the second write pulse signal WTP2 may be transferred to the shifter 411, and the first and second reset signal generators 430 and 424_3 with delay due to a long transmission line. In the present embodiment, the first write pulse signal generator 412 is disposed close to the second write pulse signal generator 416 although the first write pulse signal generator 412 can be disposed at a different location according to design.

Meanwhile, the data strobe reset signal generator 420 shifts the second write pulse signal WTP2 as long as corresponding to a predetermined burst length BL2, BL4, and BL8 and generates a data strobe reset signal DISDSP having a limited activation period in response to the first reset signal RSTB1. The data strobe reset signal generator 420 may include a shifting unit 422 and a data strobe reset signal output unit 424.

The shifting unit 422 may generate first to third shifting signals SFT_WTP1, SFT_WTP2, and SFT_WTP4 by shifting the second write pulse signal WTP2 in response to the second internal clock signal CLKP4. The shifting unit 422 may perform a reset operation in response to the first reset signal RSTB1. That is, the first to third shifting signals SFT_WTP1, SFT_WTP2, and SFT_WTP4 can be reset to a predetermined logical level value in response to the first reset signal RSTB1.

Figure 5:
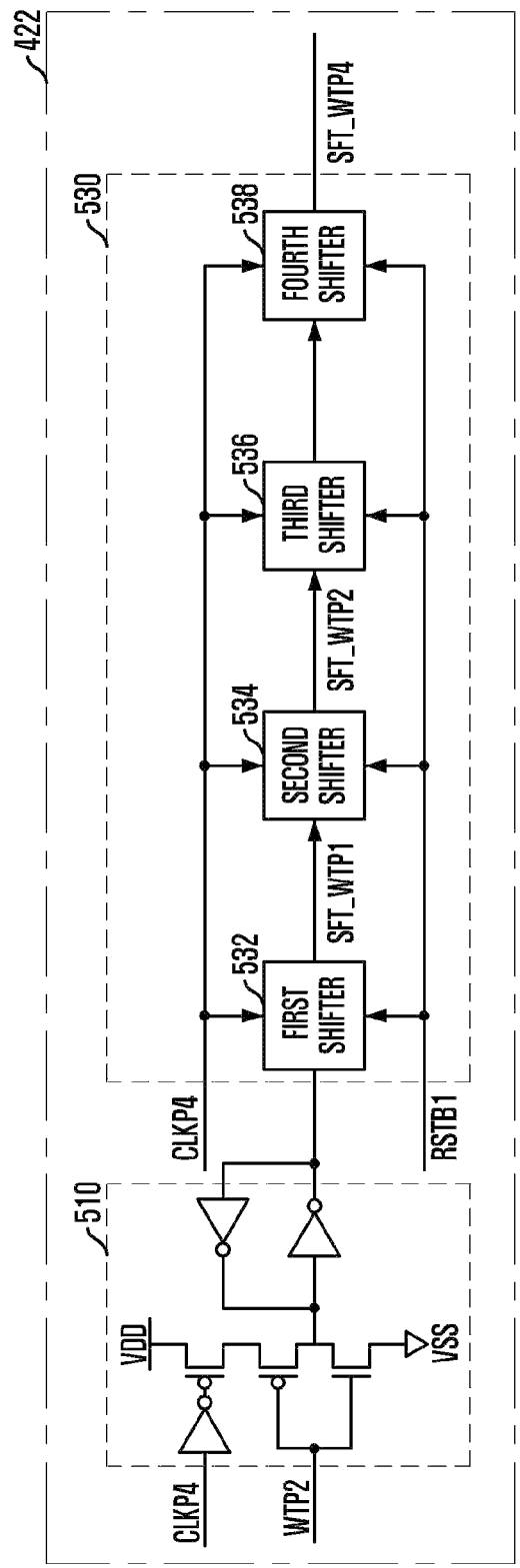
FIG. 5 is a block diagram illustrating a shifting unit of FIG. 4.

FIG. 5 is a block diagram illustrating a shifting unit 422 of FIG. 4.

Referring to FIG. 5, the shifting unit 422 may include a write pulse signal input unit 510 and a plurality of shifters 530.

The write pulse signal input unit 510 receives a second write pulse signal WTP2 and can decide a logical level of an output signal according to the second internal clock signal CLKP4 and the second write pulse signal WTP2. In other words, if the second internal clock signal CLKP4 is logical 'high' and the second write pulse signal WTP2 is logical 'low', the output signal of the write pulse signal input unit 510 is inactivated to logical 'low'. Then, if the second write pulse signal WTP2 is logical 'high', the output signal of the write pulse signal input unit 510 is activated to logical 'high'.

The plurality of shifters 530 includes a first shifter 531 for outputting a first shifting signal SFT_WTP1 by synchronizing the output signal of the write pulse signal input unit 510 with the second internal clock signal CLKP4, a second shifter 534 for outputting a second shifting signal SFT_WTP2 by synchronizing the first shifting signal SFT_WTP1 with the second internal clock signal CLKP4, a third shifter 536 for synchronizing the second shifting signal SFT_WTP2 with the second internal clock signal CLKP4 and outputting the synchronized signal, and a fourth shifter 538 for outputting a third shifting signal SFT_WTP3 by synchronizing the output signal of the third shifter 536 with the second internal clock signal CLKP4.

The first to fourth shifters 532, 534, 536, and 538 are reset in response to a first reset signal RSTB1. That is, the first to third shifting signals SFT_WTP1, SFT_WTP2, and SFT_WTP3 may be reset to a predetermined logical level value in response to the first reset signal RSTB1. The first to fourth shifters 532, 534, 536, and 538 are reset in response to the first reset signal RSTB1 and may have a structure for synchronizing the second internal clock signal CLKP4. For example, the first to fourth shifters may be embodied as a flip-flop.

Hereinafter, the first reset signal generator 420 will be described with reference to FIG. 4 again before describing the data strobe reset signal output unit 424.

The first reset signal generator 430 may generate a first reset signal RSTB1 in response to a power up signal PWRUP and the first and second write pulse signals WTP1 and WTP2. Here, the first reset signal RSTB1 is activated in response to an activation time of the first write pulse signal WTP1 and is inactivated in response to an inactivation time of the second reset signal RSTB2. The power up signal PWRUP is a signal activated if an external power voltage has an enough voltage level in a power on state of the semiconductor memory device. The semiconductor memory device uses the power up signal PWRUP to prevent critical damage such as latchup. The power up signal PWRUP has characteristic that sustains a ground power voltage while an external power voltage increases to a target voltage level and transits to an external power voltage if the external power voltage becomes greater than the target voltage level.

Figure 6:
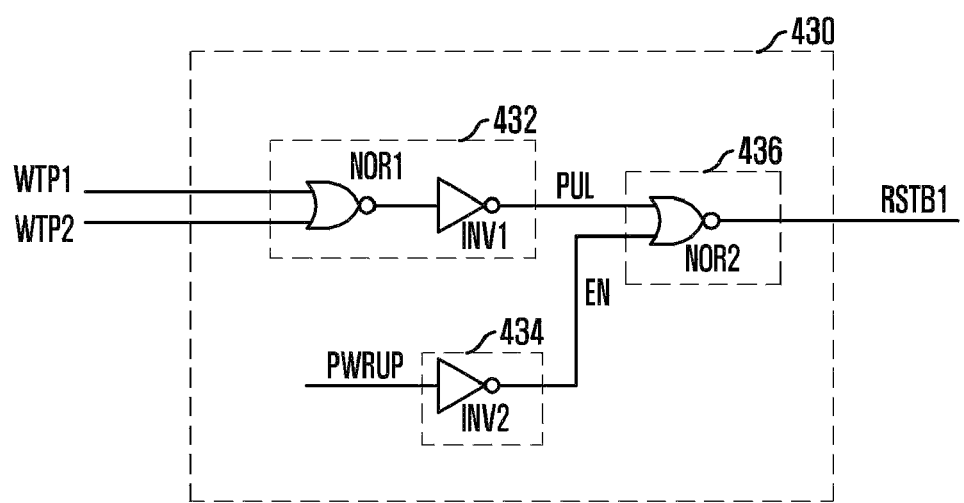
FIG. 6 is a circuit of a first reset signal generator of FIG. 4.

FIG. 6 is a circuit of a first reset signal generator 430 of FIG. 4.

Referring to FIG. 6, the first reset signal generator 430 may include a pulse signal generator 432, a power up signal input unit 434, and an output unit 436.

The pulse signal generator 432 generates a pulse signal PUL having a pulse width corresponding to the first reset signal RSTB1 in response to the first write pulse signal WTP1 and the second write pulse signal WTP2. The pulse signal generator 432 includes a first NOR gate NOR1 for receiving the first and second write pulse signals WTP1 and WTP2, and a first inverter INV1 for outputting a pulse signal PUL by inverting the output signal of the first NOR gate NOR1.

The power up signal input unit 434 outputs an activation signal EN in response to the power up signal PWRUP in order to activate the output unit 436. The power up signal input unit 434 includes a second inverter INV2 for receiving and inverting a power up signal PWRUP and outputting the inverted signal as an activation signal EN.

The output unit 436 outputs a first reset signal RSTB1 in response to the pulse signal PUL and the activation signal EN. The output unit 436 includes a second NOR gate NOR2 for receiving the pulse signal PUL and the activation signal EN and outputting the first reset signal RSTB1.

Hereinafter, the operation of the first reset signal generator 430 will be described.

At first, if the external power voltage has an enough voltage level, the power up signal PWRUP transits to the external power voltage. If the activation signal EN becomes logical 'low', the first reset signal RSTB1 may be outputted in response to the pulse signal PUL.

Here, the first and second write pulse signals WTP1 and WTP2 will be described again. The first write pulse signal WTP1 is a signal obtained by synchronizing the write instruction WT with the first internal clock CLKP2 (see FIG. 4). The second write pulse signal WTP2 is a signal obtained by synchronizing the write instruction WT with the second internal clock signal CLKP4 that is one phase faster than the first internal clock signal CLKP2. The pulse signal PUL is activated in response to an activation time of the first write pulse signal WTP1 and is inactivated in response to an inactivation time of the second write pulse signal WTP2. That is, the pulse signal PUL has an activation width that is decided in response to the first and second write pulse signals WTP1 and WTP2. Then, the first reset signal RSTB1 may be a signal having a pulse width (logical 'low') corresponding to the pulse signal PUL. The first reset signal RSTB1 according to the present embodiment may limit an activation period of the data strobe reset signal DISDSP. It will be described in more detail with reference to FIG. 10 in later.

Referring to FIG. 4 again, the data strobe reset signal output unit 424 outputs one of the first to third shifting signals SFT_WTP1, SFT_WTP2, and SFT_WTP4 corresponding to the first to third burst lengths BL2, BL4, and BL8 as a data strobe reset signal DISDSP. The data strobe reset signal output unit 424 includes an output selector 424_1, a reset signal output unit 424_2, and a second reset signal generator 424_3.

The output selector 424_1 selects one of the first to third shifting signals SFT_WTP1, SFT_WTP2, and SFT_WTP4 according to the first to third burst lengths BL2, BL4, and BL8 and outputs the selected one. Here, the activation of the first burst length BL2 means that a burst length is setup to 2, and the activation of the second burst length BL4 means that the burst length is setup to 4. The activation of the third burst length BL8 means that the burst length is setup to 8. In general, if the burst length is setup to 2, the output selector 424_1 selects and outputs the first shirting signal SFT_WTP1, which is obtained by shifting the second write pulse signal WTP2 once. If the burst length is setup to 4, the output selector 424_1 selects and outputs the second shifting signal SFT_WTP2, which is obtained by shifting the second write pulse signal WTP2 twice. If the burst length is setup to 8, the output selector 424_1 selects and outputs the third shifting signal WT4 which is obtained by shifting the second write pulse signal WTP2 four times.

Figure 7:
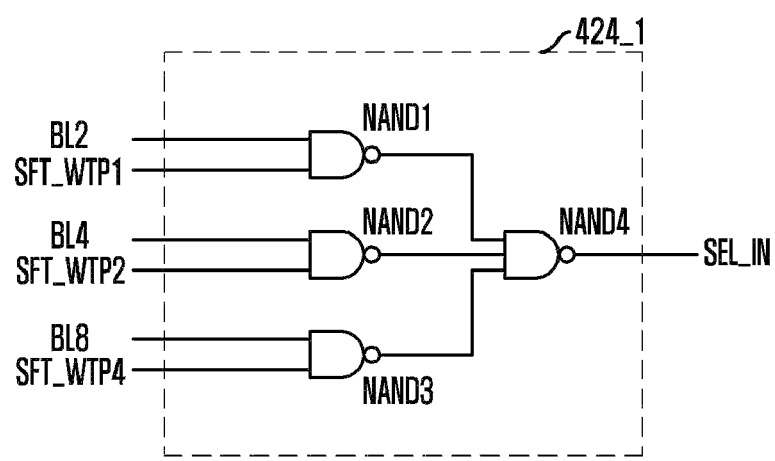
FIG. 7 is a circuit diagram illustrating an output selector of FIG. 4.

FIG. 7 is a circuit diagram illustrating an output selector 424_1 of FIG. 4.

Referring to FIG. 7, the output selector 424_1 includes a first NAND gate NAND1, a second NAND gate NAND2, a third NAND gate NAND3, and a fourth NAND gate NAND4. The first NAND gate NAND1 receives the first burst length BL2 and the first shifting signal SFT_WTP1 and performs a NAND operation thereon. The second NAND gate NAND2 receives the second burst length BL4 and the second shifting signal SFT_WTP2 and performs a NAND operation thereon. The third NAND gate NAND3 receives a third burst length BL8 and the third shifting signal SFT_WTP4 and performs a NAND operation thereon. The fourth NAND gate NAND4 receives the output signals of the first to third NAND gates NAND1, NAND2, and NAND3 and performs a NAND operation thereon.

Here, if the setup burst length is 2, the first burst length BL2 is activated. Thus, the fourth NAND gate NAND4 outputs the first shifting signal SFT_WTP1. If the setup burst length is 4, the second burst length BL4 is activated. Thus, the fourth NAND gate NAND4 outputs the second shifting signal SFT_WTP2. If the setup burst length is 8, the third burst length BL8 is activated. Thus, the fourth NAND gate NAND4 outputs the third shifting signal SFT_WTP3.

Figure 10:
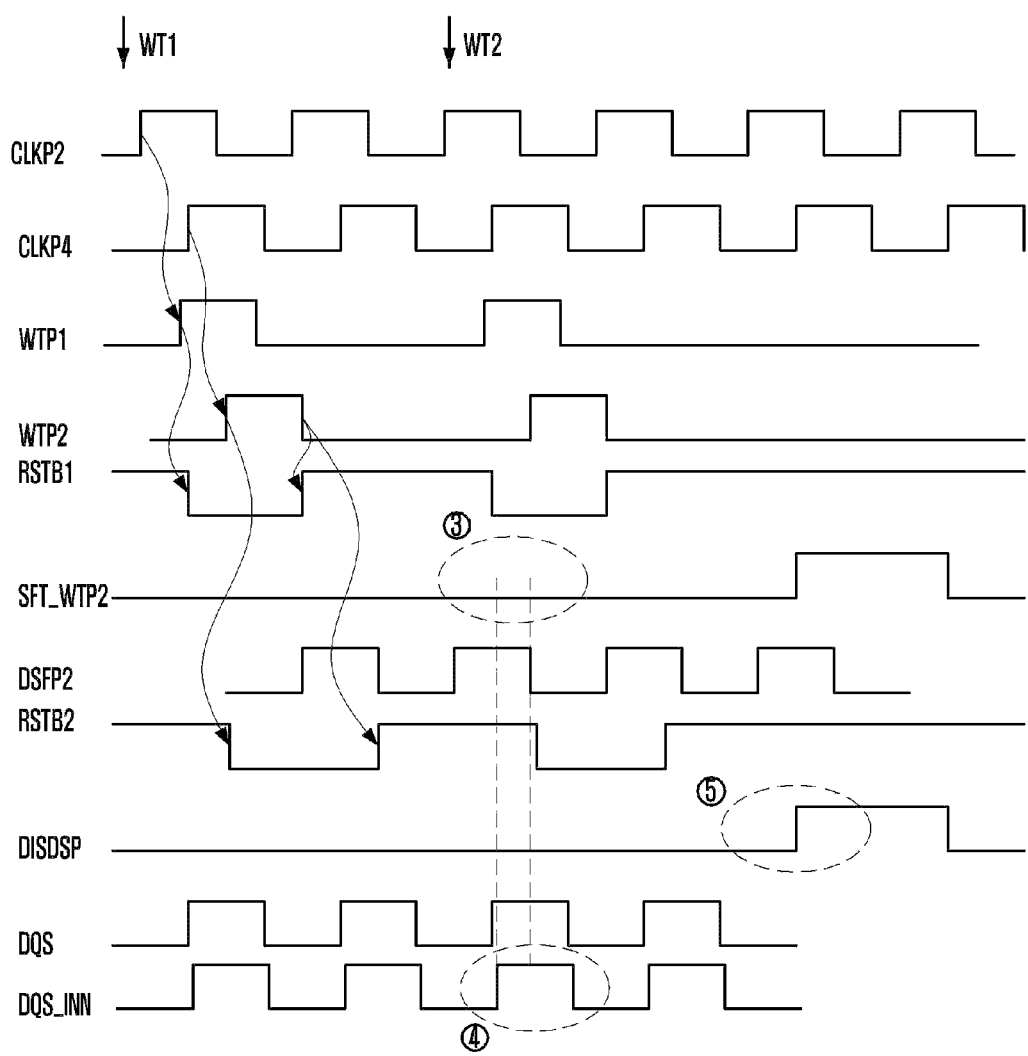
FIG. 10 is a timing diagram illustrating a timing of each signal of FIG. 4.

Referring to FIG. 4 again, the reset signal output unit 424_2 outputs a data strobe reset signal DISDSP in response to an output signal of the output selector 424_1 and the control clock signal DSFP2. Here, the control clock signal DSFP2 is a signal generated in response to a falling edge of the data strobe signal (see FIG. 10). FIG. 10 shows the control clock signal DSFP2. The reset signal output unit 424_2 may perform a reset operation in response to the second reset signal RSTB2. That is, the data strobe reset signal DISDSP may be reset in response to the second reset signal RSTB2.

Figure 8:
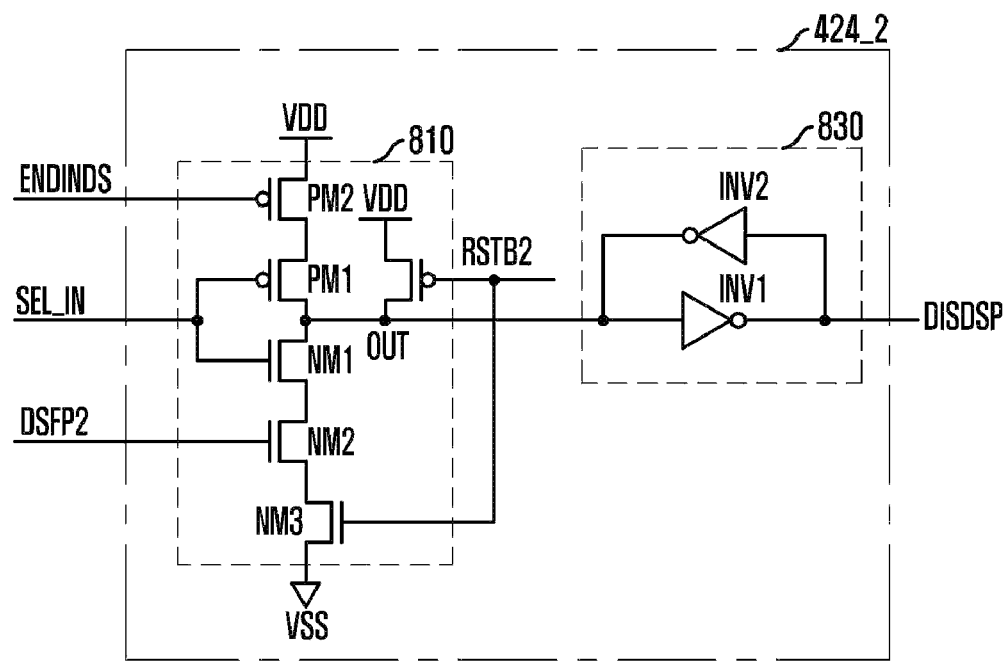
FIG. 8 is a circuit diagram illustrating a reset signal output unit of FIG. 4.

FIG. 8 is a circuit diagram illustrating a reset signal output unit 424_2 of FIG. 4. For convenience, SEL_IN is referred as a signal selected and outputted from the output selector 424_1 of FIG. 4.

Referring to FIG. 8, the reset signal output unit 424_2 includes a selection signal input unit 810 and a latching unit 830.

The selection signal input unit 810 the output signal SEL_IN of the output selector 424_1 to an output end OUT under the control of the second reset signal RSTB2, the control clock signal DSFP2, and the write period signal END-INDS. The selection signal input unit 810 includes a first PMOS transistor PM1 and a first NMOS transistor NM1 for receiving the output signal SEL_IN of the output selector 424_1 through each gate and commonly connected to one output end OUT, a second NMOS transistor MN2 formed on a source-drain path between the first NMOS transistor NM1 and the third NMOS transistor NM2 and receiving a control clock signal DSFP2 through a gate, a second PMOS transistor PM2 formed on a source-drain path between an external power voltage end VDD and the first PMOS transistor PM1 and receiving a write period signal ENDINDS through a gate, a third NMOS transistor NM3 formed on a source-drain path between the second NMOS transistor NM2 and a ground voltage end VSS and receiving a second reset signal RSTB2, and a third PMOS transistor PM3 formed on a source-drain path between an external power voltage end VDD and an output end OUT.

The write period signal ENDINDS is a signal activated at the write operation period of the semiconductor memory device. For example, the write period signal ENDINDS may be activated as logical 'low'. The second reset signal RSTB2, the control clock signal SDFP2, and the write period signal ENDINDS are signals for initializing the reset signal output unit 424_2 and for stable operation.

The latching unit 830 latches an output signal of the selection signal input unit 810. The latching unit 830 includes a first inverter INV1 for receiving the output signal of the selection signal input unit 810, inverting the output signal, and outputting the inverted output signal as the data strobe reset signal DISDSP, and a second inverter INV2 for receiving an output signal of the first inverter INV1 and inverting the received output signal for driving the output end OUT.

The reset signal output unit 424_4 is reset in response to the second reset signal RSTB2 in a write period of the semiconductor memory device, receives the output signal SEL_IN of the output selector 424_1, and outputs the data strobe reset signal DISDSP in response to the control clock signal DSFP2. Since the data strobe reset signal DISDSP according to the present embodiment is generated corresponding to the output signal of the output selector 424_1 without a glitch period by the first reset signal RSTB1, the data strobe reset signal DIS-DSP according to the present embodiment is not activated corresponding to a consecutive write instruction, and the ring-back of an internal data strobe signal can be prevented. It will be described in detail with reference to FIG. 10 again.

Referring to FIG. 4, the second reset signal generator 424_3 may generate a second reset signal generator 424_3 in response to the second write pulse signal WTP2. Here, the second reset signal RSTB2 is obtained by inverting the second write pulse signal WTP2 and extending a pulse width thereof. FIG. 10 shows the second reset signal RSTB2.

Figure 9:
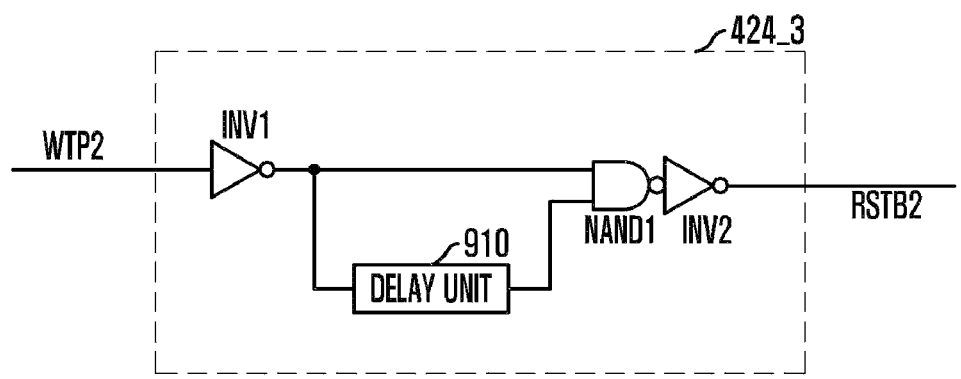
FIG. 9 is a circuit diagram illustrating a second reset signal generator of FIG. 4.

FIG. 9 is a circuit diagram illustrating a second reset signal generator 424_3 of FIG. 4.

Referring to FIG. 9, the second reset signal generator 424_3 includes a first inverter INV1 for receiving a second write pulse signal WTP2, a delay unit 190 for delaying the output signal of the first inverter INV1 as long as a predetermined time, a first NAND gate NAND1 for receiving the output signal of the inverter INV1 and the output signal of the delay unit 910 and performing a NAND operation thereon, and a second inverter INV2 for inverting the output signal of the first NAND gate NAND1 and outputting the second reset signal RSTB2. Therefore, the second reset signal RSTB2 may be a signal obtained by inverting the second write pulse signal WTP2 and extending a pulse width corresponding to the delay 910.

FIG. 10 is a timing diagram illustrating a timing of each signal of FIG. 4. FIG. 10 shows a first internal clock signal CLKP2, a second internal clock signal CLKP4, a first write pulse signal WTP1, a second write pulse signal WTP2, a first reset signal RSTB1, a second shifting signal SFT_WTP2, a control clock signal DSFP2, a second reset signal RSTB2, a data strobe reset signal DISDSP, an external data strobe signal DQS inputted from the external device, and an internal data strobe signal DQS_INN used internally. For convenience, it is assumed that a burst length is 4. That is, the output selector 424_1 of FIG. 4 selects the second shifting signal SFT_WTP2 in response to the second burst length BL4.

Referring to FIGS. 4 and 10, if the first write instruction TW1 is applied, the first write pulse signal WTP1 synchronized with the first internal clock signal CLKP2 is activated and the second write pulse signal WTP2 synchronized with the second internal clock signal CLKP4. Here, the first write pulse signal WTP1 is transferred to the first reset signal generator 430 with slight delay, and the second write pulse signal WTP2 is transferred to the shifting unit 422 and the first and second reset signal generators 430, 424_3 due to a long transmission line.

The first reset signal RSTB1 is generated as a signal that is activated in response to the first write pulse signal WTP1 and inactivated in response to the second write pulse signal WTP2. The second reset signal RSTB2 is a signal generated by inverting the second write pulse signal WTP and expanding a pulse width thereof. The first reset signal RSTB1 according to the present embodiment may have a wider activation width than a conventional first reset signal RSTB1 of FIG. 3. The first reset signal RSTB1 according to the present embodiment can substantially remove glitch of the second shifting signal SFT_WTP2. That is, the first reset signal RSTB1 according to the present embodiment may prevent unnecessary activation of the data strobe reset signal DISDSP when the write instruction is continuously applied.

Meanwhile, the shifter 422 shifts the activated second write pulse signal WTP2, and the output selector 424_1 outputs the second shifting signal SFT_WTP2 corresponding to the burst length 4. However, the second shifting signal SFR_WTP2 is reset to logical 'low' as shown in ③ because the first reset signal RSTB1 is activated to logical 'low' corresponding to the second write instruction WT2. Finally, glitch of the second shifting signal SFR_WTP2 is disappeared, and the data strobe reset signal DISDSP is not activated.

Figure 3:
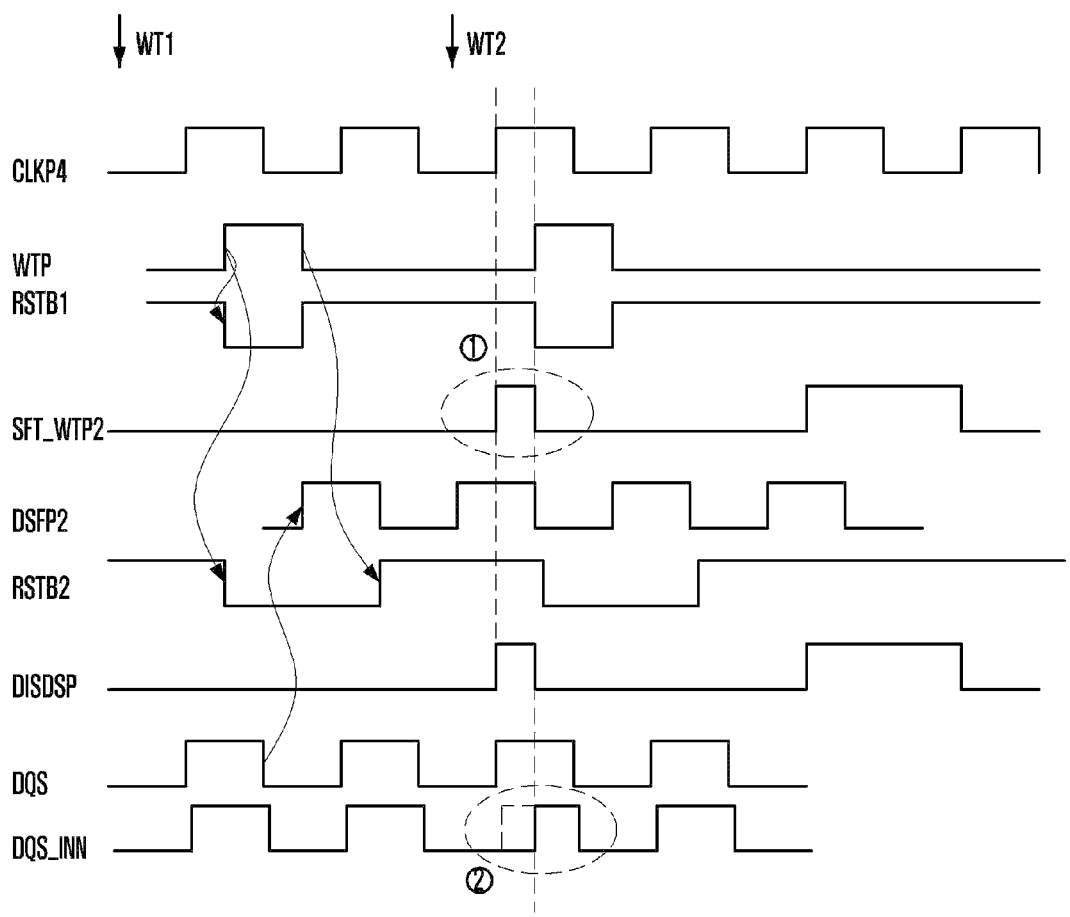
FIG. 3 illustrates a timing diagram for describing timing of each signal in FIG. 1.

In other words, the second shifting signal SFT_WTP2 is activated corresponding to the first write instruction TW1 as shown in ① of FIG. 3 in case of a typical data strobe reset signal generation circuit. However, the second shifting signal SFT_WTP2 is not activated as shown in ③ by the first reset signal RSTB1 corresponding to the second write instruction WT2 in case of the data strobe reset signal generation circuit according to the present embodiment. Continuously, the data strobe reset signal DISDSP is not activated because the data strobe reset signal DISDSP is a signal generated in response to the second shifting signal SFT_WTP2. Finally, it is possible to generate a stable internal data strobe signal DQS_INN corresponding to the second write instruction WT2 as shown in ④.

Then, the data strobe reset signal DISDSP activated corresponding to the second write instruction WT2 as shown in ⑤ drives the internal data strobe signal DQS_INN as logical 'low', thereby preventing ring-back of the internal data strobe signal DQS_INN. That is, the second reset signal RSTB2 can be stably limited in an activation period of the data strobe reset signal DISDSP. Therefore, it is possible to generate a stable internal data strobe signal DQS_INN.

Figure 11:
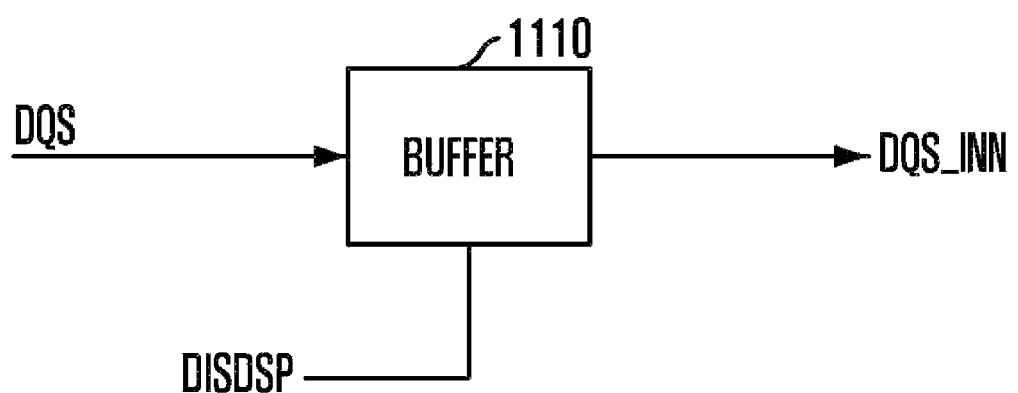
FIG. 11 is a block diagram illustrating a buffer for receiving an external data strobe signal DQS and generating an internal data strobe signal DQS_INN.

FIG. 11 is a block diagram illustrating a buffer 1110 for receiving an external data strobe signal DQS and generating an internal data strobe signal DQS_INN. With reference to FIG. 11, a block for generating an internal data strobe signal DQS_INN of FIG. 10 will be described. In other words, the external data strobe signal DQS is a signal synchronized with data and applied when a write instruction is inputted, and the internal data strobe signal DQS_INN is a signal obtained by buffering the external data strobe signal DQS. Meanwhile, the buffer 1110 is reset in response to the data strobe reset signal DISDSP. That is, the internal data strobe signal DQS_INN is reset to, for example, logical 'low' in response to the data strobe reset signal DISDSP. The detail circuitry structure of the buffer 1110 is omitted. Here, the internal data strobe signal DQS_INN may be reset in response to the data strobe reset signal DISDSP only for a desired period.

In the present embodiment, the internal data strobe signal DQS_INN and data can be guaranteed to have stable tDQSS. That is, the internal data strobe signal DQS_INN and data corresponding to the first write instruction WT1 can have guarantee to have stable tDQSS. The internal data strobe DQS_INN corresponding to the second write instruction WT2 can also have guarantee to have stable tDQSS because typical glitch period is removed.

Figure 12A:
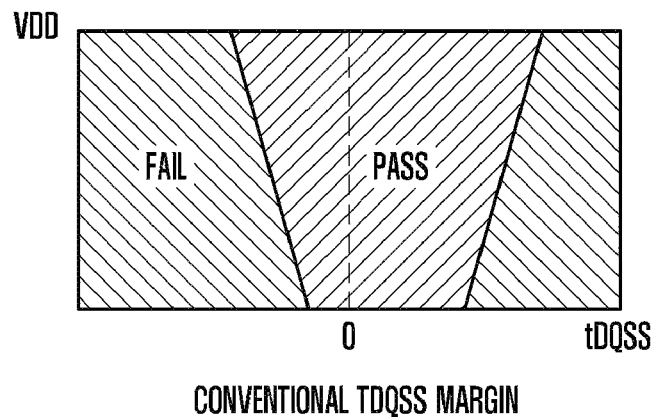
FIGS. 12a and 12b are graphs for describing tDQSS margin of an internal data strobe signal DQS_INN and data.
Figure 12B:
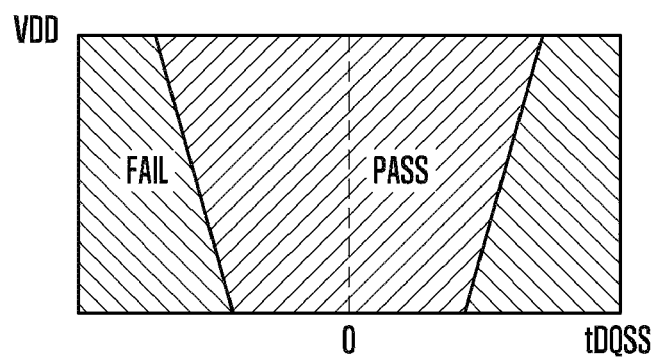

FIGS. 12a and 12b are graphs for describing tDQSS margin of an internal data strobe signal DQS_INN and data. FIG. 12a is a graph corresponding to a typical semiconductor memory device, and FIG. 12b is a graph corresponding to a semiconductor memory device according to an embodiment of the invention. In FIGS. 12a and 12b, a vertical axis denotes tDQSS and a horizontal axis denotes a voltage lvel of an external power voltage end VDD. For example, the tDQSS margin increases as the voltage level of the external power voltage end VDD increases. On the contrary, the tDQSS margin decreases as the voltage level of the external power voltage end VDD decreases.

Referring to FIG. 12a, a pulse width of the internal data strobe signal DQS_INN is reduced because a necessary reset operation is performed in case of a semiconductor memory device according to the related art. Finally, a fail period FAIL where data is not properly received is extended and a pass period PASS where data is properly received is reduced because the tDQSS margin is reduced Referring to FIG. 12b, the semiconductor memory device prevents unnecessary reset operation. A pulse width of the internal data strobe signal DQS_INN has the same pulse width of the external data strobe signal DQS. Finally, the tDQSS margin may be improved, and the stable pass period PASS can be extended.

Figure 13:
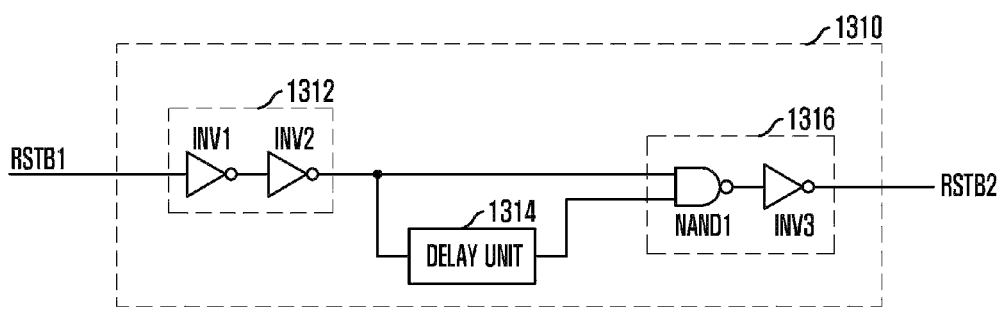
FIG. 13 is a block diagram illustrating a part of a semiconductor memory device according to a second embodiment of the invention.

FIG. 13 is a block diagram illustrating a part of a semiconductor memory device according to a second embodiment of the invention. The semiconductor memory device according to the second embodiment includes a second reset signal generator having an improved structure of the second reset signal generator 424_3 of the first embodiment. For convenience, a reference numeral 1310 is assigned to the second reset signal generator.

Referring to FIG. 12, the second reset signal generator 1310 includes a first reset signal input unit 1312, a delay unit 1314, and a second reset signal output unit 1316.

The first reset signal input unit 1312 may include first and second inverters INV1 and INV2 for receiving a first reset signal RST1. The first and second inverters INV1 and INV2 are disposed for adjusting a logical level value such as the second write pulse signal WTP2 of the first embodiment. The first and second inverters INV1 and INV2 may have different structures according to design.

The delay unit 1314 delays the output signal of the first reset signal input unit 1312 as long as a predetermined time. The delay unit 1314 is a circuit corresponding the circuit of the first embodiment for generating a second reset signal RSTB2 by delaying it as long as a predetermined time.

The second reset signal output unit 1316 generates a second reset signal RSTB2 in response to an output signal of the first reset signal input unit 1312 and an output signal of the delay unit 1314. The second reset signal output unit 1316 includes a first NAND gate NAND1 for receiving the output signal of the first rest signal input unit 1312 and the output signal of the delay unit 1314, and a third inverter INV3 for inverting the output signal of the first NAND gate NAND1 and outputting the inverted output signal as the second reset signal RSTB2.

The second reset signal RSTB2 according to the second embodiment has a pulse width more expanded than that of the second reset signal of the first embodiment. Therefore, the glitch of the second shifting signal SFT_WTP2 (see FIG. 10) can be controlled.

Figure 14:
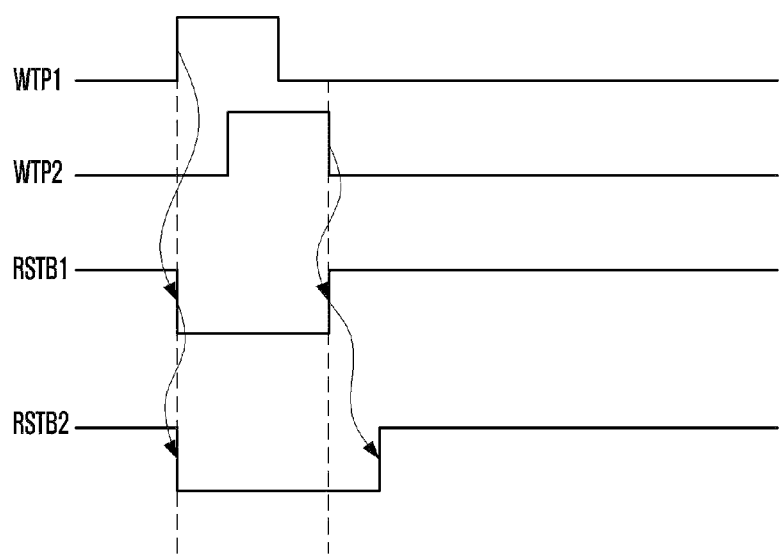
FIG. 14 is a timing diagram illustrating timings of signals related to the second reset signal generator of FIG. 13.

FIG. 14 is a timing diagram illustrating timings of signals related to the second reset signal generator 1310 of FIG. 13. FIG. 14 shows a first write pulse signal WTP1, a second write pulse signal WTP2, a first reset signal RSTB1, and a second reset signal RSTB2.

Referring to FIGS. 13 and 14, the first reset signal RSTB1 is activated to logical 'low' in response to an activation time of the first write pulse signal WTP1 and inactivated to logical 'high' in response to an inactivation time of the second write pulse signal WTP2 as described in FIG. 10. The second reset signal generator 1310 may generate a second reset signal RSTB2 having an extended pulse width in response to the first reset signal RSTB1. That is, the second reset signal RSTB1 is activated to logical 'low' in response to an activation time of the first reset signal RST1. The second reset signal RSTB1 is activated at an inactivation time of the first reset signal RST1 as long as a delay time reflected in the delay unit 1314 and then inactivated. Therefore, the reset signal output unit 424_2 (see FIG. 4), which is reset in response to the second reset signal RSTB2, may generate a stable data strobe reset signal DISDSP. That is, the activation period of the data strobe reset signal DISDSP may be limited by the second reset signal RSTB2. In other words, the semiconductor memory device according to the second embodiment provides the effects identical to that shown in FIG. 12b.

As described above, the semiconductor memory device can guarantee to provide the stable tDQSS having a wide pass period although a voltage level of a power voltage is lowered. It means that reliability of the semiconductor memory device can be improved by reducing errors thereof. That is, the semiconductor memory device can stably operate although it is driven at a fast operation frequency.

The semiconductor memory device according to the present embodiment can guarantee stable tDQSS by removing a glitch period for consecutive write instructions.

The semiconductor memory device according to the present embodiment can stably receive data corresponding to the data strobe signal although an operation frequency becomes high frequency. Therefore, the reliability of the semiconductor memory device can be improved.

While the invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
   a pulse signal generator configured to generate first and second pulse signals by synchronizing a write instruction with first and second internal clock signals;
   a reset signal generator configured to generate a reset signal having an activation width setup in response to the first and second pulse signals; and
   a data strobe reset signal generator configured to generate a data strobe reset signal by shifting the second pulse signal as much as a predetermined burst length and limiting an activation period of the data strobe reset signal in response to the reset signal.

2. The semiconductor memory device as recited in claim 1, further comprising a buffer configured to generate an internal data strobe signal by buffering an external data strobe signal, which is applied after being synchronized with data corresponding to the write instruction, in response to the data strobe reset signal.

3. The semiconductor memory device as recited in claim 1, wherein the first internal clock signal has a phase faster than that of the second internal clock signal.

4. The semiconductor memory device as recited in claim 1, wherein the pulse signal generator includes
   a first pulse signal generator configured to generate the first pulse signal by synchronizing the write instruction with the first internal clock signal,
   a delay unit configured to generate the second internal clock signal by delaying the first internal clock signal as long as a predetermined time, and
   a second pulse signal generator configured to generate the second pulse signal by synchronizing the write instruction with the second internal clock signal.

5. The semiconductor memory device as recited in claim 1, wherein the reset signal is activated in response to the first pulse signal and inactivated in response to the second pulse signal.

6. The semiconductor memory device as recited in claim 1, wherein the reset signal generator includes a pulse signal generator configured to generate a pulse signal having a pulse width corresponding to the reset signal, in response to the first and second pulse signals, and an output unit configured to output the reset signal in response to the pulse signal.

7. The semiconductor memory device as recited in claim 6, wherein the pulse signal is activated in response to an activation time of the first pulse signal and inactivated in response to an inactivation time of the second pulse signal.

8. A semiconductor memory device, comprising:
   a pulse signal generator configured to generate first and second pulse signal by synchronizing a write instruction with first and second internal clock signals;
   a reset signal generator configured to generate a reset signal having an activate width, that is set up in response to the first and second pulse signals;
   a shifter configured to be reset in response to the reset signal and to shift the second pulse signal in response to the second internal clock signal; and
   a data strobe reset signal-output unit configured to output a shifting signal corresponding to a predetermined burst length among output signals of the shifter as a data strobe reset signal.

9. The semiconductor memory device as recited in claim 8, wherein the shifter includes an input unit configured to receive the second pulse signal, and a plurality of shifting units configured to be reset in response to the reset signal and shift the output signal of the input unit in response to the second internal clock signal.

10. The semiconductor memory device as recited in claim 9, wherein the output signals of the plurality of shifting units are reset to a predetermined logical level value in response to the reset signal.

11. The semiconductor memory device as recited in claim 8, wherein the data strobe reset signal output unit includes:
    an output selector configured selectively to output a shifting signal corresponding to the burst length among the output signals of the shifter,
    a reset signal output unit configured to output an output signal of the output selector as the data strobe reset signal, and
    a reset signal generator configured to generate a reset signal to reset the reset signal output unit in response to the second pulse signal.

12. The semiconductor memory device as recited in claim 8, wherein the activation period of the data strobe reset signal is limited in response to the reset signal.

13. The semiconductor memory device as recited in claim 8, further comprising a buffer configured to generate an internal data strobe signal by buffering an external data strobe signal, which is applied after being synchronized with data corresponding to the write instruction, in response to the data strobe reset signal.

14. The semiconductor memory device as recited in claim 8, wherein the first internal clock signal has a phase faster than the second internal clock signal.

15. The semiconductor memory device as recited in claim 8, wherein the pulse signal generator includes
   a first pulse signal generator configured to generate the first pulse signal by synchronizing the write instruction with the first internal clock signal,
   a delay unit configured to generate the second internal clock signal by delaying the first internal clock signal as long as a predetermined time, and
   a second pulse signal generator configured to generate the second pulse signal by synchronizing the write instruction with the second internal clock signal.

16. The semiconductor memory device as recited in claim 8, wherein the reset signal is activated in response to the first pulse signal and inactivated in response to the second pulse signal.

17. The semiconductor memory device as recited in claim 8, wherein the reset signal generator includes a pulse signal generator configured to generate a pulse signal having a pulse width corresponding to the reset signal, in response to the first and second pulse signal, and an output unit configured to output the reset signal in response to the pulse signal.

18. The semiconductor memory device as recited in claim 17, wherein the pulse signal is activated in response to an activation time of the first pulse signal and inactivated in response to an inactivation time of the second pulse signal.

19. A semiconductor memory device comprising:
   a pulse signal generator configured to generate first and second pulse signals by synchronizing a write instruction with first and second internal clock signals;
   a first reset signal generator configured to generate a first reset signal having an activation width setup in response to the first and second pulse signals;
   a second reset signal generator configured to generate a second reset signal by delaying a pulse width of the first reset signal as long as a predetermined time;
   a shifter configured to shift the second pulse signal in response to the second internal clock signal;
   an output selector configured selectively to output a shifting signal corresponding to predetermined burst length among output signals of the shifter; and
   a data strobe reset signal output unit configured to be reset in response to the second reset signal and to output an output signal of the output selector as a data strobe reset signal.

20. The semiconductor memory device as recited in claim 19, wherein the data strobe reset signal output unit includes an input unit configured to be reset in response to the second reset signal and to receive an output signal of the output selector, and a latching unit configured to output an output signal of the input unit as the data strobe reset signal by latching the output signal of the input unit.

21. The semiconductor memory device as recited in claim 20, wherein input of the input unit is limited in response to the second reset signal.

22. The semiconductor memory device as recited in claim 19, wherein the activation period of the data strobe reset signal is limited in response to the second reset signal.

23. The semiconductor memory device as recited in claim 19, wherein the second reset signal generator includes
   a first reset signal input unit configured to receive the first reset signal,
   a delay unit configured to delay an output signal of the first reset signal input unit as long as the predetermined time and to output the delayed output signal, and
   an output unit configured to output the second reset signal in response to an output signal of the first reset signal input unit and an output signal of the delay unit.

24. The semiconductor memory device as recited in claim 23, wherein the second reset signal is activated in response to an activation time of the first write pulse signal and inactivated in response to an inactivation time of the second write pulse signal.

25. The semiconductor memory device as recited in claim 19, further comprising a buffer configured to generate an internal data strobe signal by buffering an external data strobe signal, which is applied after being synchronized with data corresponding to the write instruction, in response to the data strobe reset signal.

26. The semiconductor memory device as recited in claim 19, wherein the first internal clock signal has a phase faster than the second internal clock signal.

27. The semiconductor memory device as recited in claim 19, wherein the pulse signal generator includes
   a first pulse signal generator configured to generate the first pulse signal by synchronizing the write instruction with the first internal clock signal,
   a delay unit configured to generate the second internal clock signal by delaying the first internal clock signal as long as a predetermined time; and
   a second pulse signal generator configured to generate the second pulse signal by synchronizing the write instruction with the second internal clock signal.

28. The semiconductor memory device as recited in claim 19, wherein the first reset signal is activated in response to the first pulse signal and inactivated in response to the second pulse signal.

29. The semiconductor memory device as recited in claim 19, wherein the first reset signal generator includes a pulse signal generator configured to generate a phase signal having a pulse width corresponding to the first reset signal, in response to the first and second pulse signals; and an output unit configured to output the first reset signal in response to the pulse signal.

30. The semiconductor memory device as recited in claim 29, wherein the pulse signal is activated in response to an activation time of the first pulse signal and inactivated in response to an inactivation time of the second pulse signal.

31. A method for driving a semiconductor memory device, comprising:
   generating a first pulse signal by synchronizing a write instruction with a first internal clock signal faster than a second internal clock signal;
   generating a second pulse signal by synchronizing the write instruction with the second internal clock signal;

generating a data strobe reset signal by shifting the second pulse signal as much as a predetermined burst length in response to the second internal clock signal; and limiting an activation period of the data strobe reset signal in response to the first pulse signal.

32. The method as recited in claim 31, further comprising generating an internal data strobe signal by buffering an external data strobe signal, which is applied after being synchronized with data corresponding to the write instruction, in response to the data strobe reset signal.

33. The method as recited in claim 31, wherein the data strobe reset signal is activated in response to the first pulse signal and inactivated in response to the second pulse signal.

* * * * *